United States Patent
Karp

(10) Patent No.: US 9,013,844 B2
(45) Date of Patent: Apr. 21, 2015

(54) CIRCUIT FOR AND METHOD OF ENABLING THE DISCHARGE OF ELECTRIC CHARGE IN AN INTEGRATED CIRCUIT

(71) Applicant: Xilinx, Inc., San Jose, CA (US)

(72) Inventor: James Karp, Saratoga, CA (US)

(73) Assignee: Xilinx, Inc., San Jose, CA (US)

( * ) Notice: Subject to any disclaimer, the term of this patent is extended or adjusted under 35 U.S.C. 154(b) by 204 days.

(21) Appl. No.: 13/741,619

(22) Filed: Jan. 15, 2013

(65) Prior Publication Data

US 2014/0198416 A1  Jul. 17, 2014

(51) Int. Cl.
*H02H 9/04* (2006.01)
*H01L 27/06* (2006.01)
*H01L 27/02* (2006.01)

(52) U.S. Cl.
CPC ............ *H02H 9/044* (2013.01); *H01L 27/0629* (2013.01); *H01L 27/0251* (2013.01); *H01L 27/0255* (2013.01)

(58) Field of Classification Search
CPC ............ H01L 27/0251; H01L 27/0255; H01L 27/0629; H02H 9/044
USPC .......................................................... 361/56
See application file for complete search history.

(56) References Cited

U.S. PATENT DOCUMENTS

| | | | |
|---|---|---|---|
| 5,477,413 A * | 12/1995 | Watt | 361/56 |
| 6,597,550 B1 | 7/2003 | Chey et al. | |
| 7,179,691 B1 * | 2/2007 | Lee et al. | 438/135 |
| 8,134,813 B2 | 3/2012 | Karp et al. | |
| 2004/0190209 A1 * | 9/2004 | Jozwiak et al. | 361/56 |
| 2006/0033163 A1 | 2/2006 | Chen | |
| 2011/0026173 A1 * | 2/2011 | Karp | 361/56 |
| 2011/0298559 A1 * | 12/2011 | Kitching et al. | 333/103 |
| 2012/0091530 A1 | 4/2012 | Campi, Jr. et al. | |

FOREIGN PATENT DOCUMENTS

| | | |
|---|---|---|
| EP | 1 808 893 A2 | 7/2007 |
| EP | 1 808 893 A3 | 7/2007 |
| JP | 60-224259 | 11/1985 |
| TW | 484 227 B | 4/2002 |
| WO | WO 03/005523 A2 | 1/2003 |
| WO | WO 03/005523 A3 | 1/2003 |
| WO | WO 2010/088014 A1 | 8/2010 |

* cited by examiner

*Primary Examiner* — Thienvu Tran
*Assistant Examiner* — Kevin J Comber
(74) *Attorney, Agent, or Firm* — John J. King

(57) ABSTRACT

A circuit for enabling the discharge of electric charge in an integrated circuit is described. The circuit comprises an input/output pad coupled to a first node; a first diode coupled between the first node and a ground node; a transistor coupled in parallel with the first diode between the first node and ground node; and a resistor coupled between a body portion of the transistor and the ground node. A method of enabling the discharge of electric charge is also described.

20 Claims, 6 Drawing Sheets

CIRCUIT FOR AND METHOD OF ENABLING THE DISCHARGE OF ELECTRIC CHARGE IN AN INTEGRATED CIRCUIT

TECHNICAL FIELD

The present invention relates generally to integrated circuits, and in particular, to a circuit for and method of enabling the discharge of electric charge in an integrated circuit.

BACKGROUND

A charge device model (CDM) is a model for characterizing the likelihood of an electronic device being damaged from an electrostatic discharge (ESD), such as by the touching of a contact of an integrated circuit. CDM testing consists of charging a package to a specified voltage, then discharging this voltage through a package lead. The discharge current is limited only by the parasitic impedance and capacitance of the device. Therefore, CDM discharge current can find multiple paths on the die to get out to the package lead. The goal of ESD design is to provide an intended low impedance path with enough routing recourses to handle CDM discharge current, and prevent damage to internal circuits on the die.

However, the discharge of electric charge through parasitic paths, which are often available in conventional devices for discharge in parallel with an intended path, can result in damage to the integrated circuit. These parasitic paths are weaker and are generally the first to fail, leading to an increase of leakage current at the I/O pad. Not only does increased leakage current change the operation of the transistor, but it may also lead to failure of the integrated circuit. Because integrated circuits are implemented in larger systems, the failure of an integrated circuit can lead to the failure of the larger system as a whole. Accordingly, it is beneficial to reduce the effects of electrostatic discharge on integrated circuits.

SUMMARY

A circuit for enabling the discharge of electric charge in an integrated circuit is described. The circuit comprises an input/output pad coupled to a first node; a first diode coupled between the first node and a ground node; a transistor coupled in parallel with the first diode between the first node and the ground node; and a resistor coupled between a body portion of the N-channel transistor and the ground node.

According to another arrangement, a circuit for enabling the discharge of electric charge in an integrated circuit comprises a first input/output pad coupled to a first node; a first diode coupled between the first node and a ground node; a first transistor coupled in parallel with the first diode between the first node and the ground node; a first resistor coupled between a body portion of the first transistor and the ground node; a second input/output pad coupled to a second node; a second diode coupled between the second node and the ground node; a second transistor coupled in parallel with the second diode between the second node and the ground node; and a second resistor coupled between a body portion of the second transistor and the ground node.

A method of enabling the discharge of electric charge in an integrated circuit is also described. The method comprises providing an input/output pad; coupling a diode between a first node at the input/output pad and a ground node; coupling an transistor between the first node and the ground node; and increasing the resistance of a discharge path between a body portion of the transistor and the ground node.

BRIEF DESCRIPTION OF THE DRAWINGS

FIGS. 5-1 through 5-4 together form a series of cross-sectional views showing the formation of a portion of the circuit of FIG. 2;

DETAILED DESCRIPTION

Figure 1:
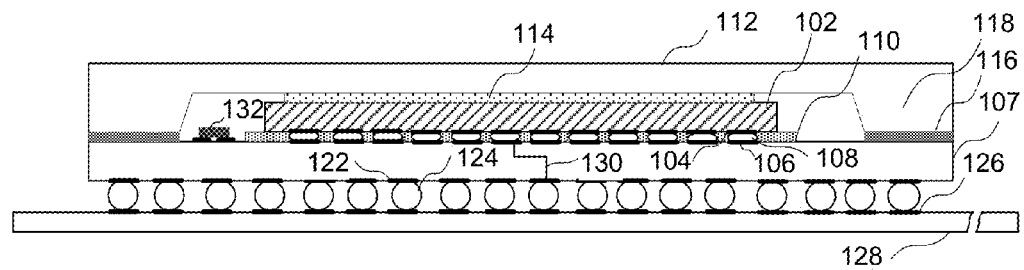
FIG. 1 is a cross-sectional view of an integrated circuit package.

Turning first to FIG. 1, an integrated circuit package comprises a die 102 having a plurality of contact pads 104 enabling connections to contact pads 106 of the substrate 107 by way of corresponding solder bumps 108. An underfill 110 may also be applied under the die 102. A lid 112 is then attached to the substrate by way of a bonding agent 114 between the die and the lid, and a bonding agent 116 between a side wall 118 of the lid and the substrate. Contact pads 122 on the substrate are also provided to make an electrical connection by way of solder balls 124 between the substrate and another device. For example, the solder balls may make a connection to contact pads 126 of a printed circuit board 128. Interconnects 130, which may comprise traces of various metal layers separated by dielectric layers and vias between the traces, for example, enable an electrical connection between solder bumps 108 and solder balls 124. One or more resistors 132 placed on the substrate and connected to the die by interconnects could be implemented to increase the resistance of a discharge path as will be described in more detail below.

Figure 2:
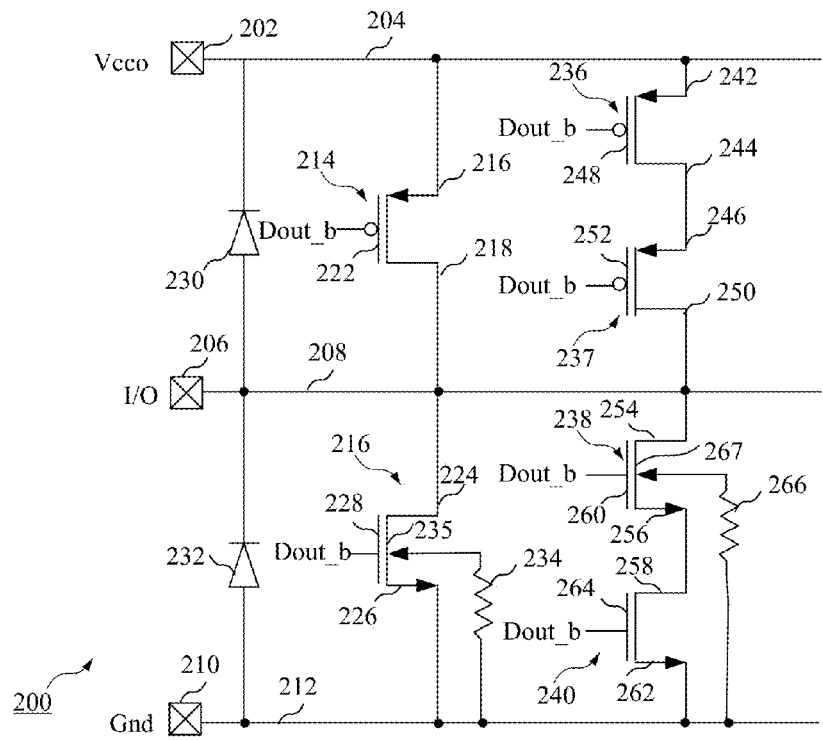
FIG. 2 is block diagram of a circuit for enabling the discharge of electric charge in an integrated circuit.

Turning now to FIG. 2, a block diagram of a circuit for enabling the discharge of electric charge in an integrated circuit is shown. The circuit of FIG. 2 comprises a reference node 204, shown here coupled to a Vcco pad 202, an I/O pad 206 coupled to a node 208, and another reference voltage node 212, shown here coupled to a ground pad 210. The Vcco pad 204, I/O pad 206 and the ground pad 210 may be external contact pads for the die 102 or the substrate 107 of an integrated circuit device, such as the integrated circuit device of FIG. 1, for example. A CMOS pair of transistors comprising P-type transistor 214 and N-type transistor 216 is coupled between the reference node 204 and the reference node 212. In particular, a source 216 of the P-channel transistor 214 is coupled to the reference node 204, while a drain 218 is coupled to the node 208 coupled to the I/O pad. Inverted output data (Dout_b) is coupled to a gate 222 of the transistor 214. An N-channel transistor 216 has a drain 224 coupled to the node 208, which a source 226 is coupled to ground 212. The output data (Dout) is coupled to a gate 228 of the transistor 216. Output data is generated at the node 208, and therefore at the I/O pad 206, based upon inverted output data coupled to the transistors 216 and 214. For example, when the output data intended to be generated at the I/O pad 206 is high, a low Dout_b signal is generated at the gate of transistor 214 (turning on transistor 214) and at the gate of transistor 216 (turning off transistor 216) to pull the voltage at the I/O pad 206 high.

A Human Body Module (HBM) diode 230 is coupled between the node 208 and the node 204 as shown to enable the discharge of negative charge to positive reference voltage at node 204. Similarly, an HBM diode 232 is coupled between the node 208 and the node 212 to enable the discharge of positive charge to ground at node 212.

However, according to the various circuits for enabling the discharge of electric charge, a resistor is provided to increase the resistance in an undesirable path, such as a parasitic path which would be present in a conventional I/O circuit, to drive more current to the HBM diode. As shown in FIG. 2, a resistor 234 is coupled between a body portion 235 of the transistor 216 and the node 212. As the CDM voltage increases, an NMOS transistor 216 connected to the pad is the first to start showing signs of degradation. More particularly, the drain 224 of NMOS 216 of the CMOS pair is effectively a parasitic diode connected in parallel with intended CDM discharge path via HBM diode 232 in a conventional I/O circuit. That is, in a conventional I/O circuit, the parasitic path would be represented by a parasitic diode connected between the drain 224 and the ground node 212 in parallel with an intended CDM discharge path provided by the HBM diode 232. Even a portion of this current flowing next to drain-gate oxide interface through the parasitic diode can damage this interface, resulting in an increase of I/O leakage current to the ground. By placing resistor 234 from the body 235 to ground, excess charge to the I/O node can be effectively driven to ground. As will be described in more detail in reference to FIG. 3, an arrangement of wells and diffusion regions enable the formation of the resistor 234 in a discharge path coupled to the body of the transistor. Resistor 234 could be a 100-200 Ohm resistor to effectively re-direct the discharge of charge toward the low resistance HBM diode 232, which is the intended discharge path.

The circuit of FIG. 2 also comprises a second output circuit for generating a different voltage at I/O pad 206. In particular, a first pair of transistors 236 and 237 is coupled between the node 204 and 208, and a second pair of transistors 238 and 240 is coupled between the node 208 and the node 212. The P-type transistor 236 comprises a source 242 coupled to the reference node 204 and a drain 244 coupled to a source 246 of the transistor 237. A gate 248 is coupled to receive the Dout_b signal. The P-type transistor 237 also includes a drain 250 coupled to the node 208, and a gate 252 coupled to receive the Dout_b signal. The N-type transistor 238 of the second pair of transistors comprises a drain 254 coupled to the node 208 and a source 256 coupled to a drain 258 of the transistor 240. A gate 260 is coupled to receive the Dout signal. The P-type transistor 240 also includes a source 262 coupled to the node 212, and a gate 264 coupled to receive the Dout signal. A resistor 266 is coupled to a body portion 267 of transistor 238. The drain of the transistor 238 of the CMOS pair is effectively a parasitic diode connected in parallel with intended CDM discharge path via HBM diode 232 in a conventional device. The resistor 266 increases the resistance in the parasitic path, and therefore re-directs substrate discharge toward the low resistance HBM diode 232 as described above in reference to resistor 234.

Figure 3:
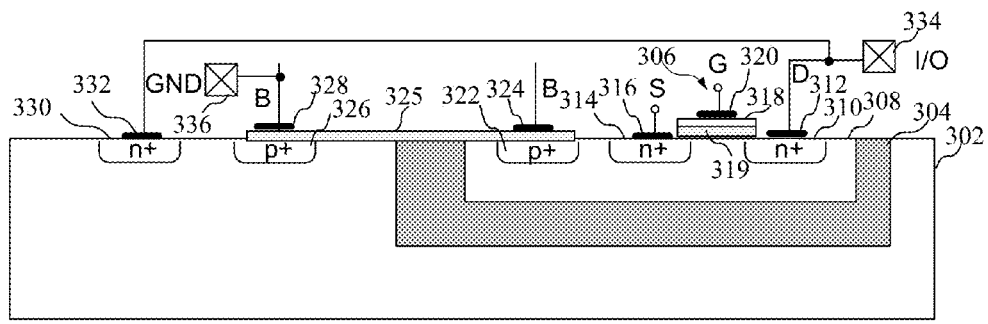
FIG. 3 is a cross-sectional view of a portion of the circuit of FIGS. 2 and 4.

Turning now to FIG. 3, a cross-sectional view of a portion of the circuit of FIG. 2 having a resistor for increasing the impedance in an I/O circuit is shown. In particular, a p-type substrate 302 of an integrated circuit, such as die 102 of FIG. 2, comprises a deep N-well 304 which enables the formation of an NMOS transistor 306 (such as transistor 216 or 238 for example connected to the I/O pad 206) to be processed in a P-well 308 which is isolated from rest of P-substrate 302 by the deep N-well 304. The NMOS transistor 306 formed in the P-well 308 comprises an N-type region 310 having a contact portion 312 (which may comprise the drain of the transistor), and an N-type region 314 having a contract portion 316 (which may comprise the source of the transistor). A gate of the transistor may comprise a gate portion 318 extending over a gate oxide portion 319 and coupled to a gate contact 320.

A resistor 325, which could be resistor 234 or 266 of FIG. 2 for example, is coupled between a P-type region 322 in the P-well 308 at a contact 324 and a P-type region 326 at a contact 328 which is coupled to the ground node. The gate 318 and resistor 325 could be a polysilicon material, for example. While the resistor 325 is shown here as a portion of a polysilicon layer, the resistor could comprise any type of resistor formed on the substrate during the formation of the integrated circuit, or it could be a resistor external to the die of the integrated circuit which is coupled to the contacts 324 and 328 of FIG. 4. For example, the external resistor could be resistor 132 of FIG. 1, where a separate resistor may be provided for each I/O pad of the substrate of the integrated circuit. An HBM diode, such as HBM diode 232, is provided between an I/O pad 334, such as I/O pad 206, and a ground node coupled to an I/O pad 336. In particular, the n-type region 330 provides a P-N junction enabling positive charge to be coupled to the substrate 302, which is coupled to ground by the diffusion region 326, the contact 328 and the contact pad 336. While some excess charge may be discharged by way of the HBM diode 232 in a conventional device, some charge may be discharged from the I/O pad to the gate oxide region 319 by way of the drain region 310. By providing the deep N-well 304 and enabling isolation of the P-well 308 from the P-type substrate 302, a resistance of a discharge path from the drain 310 to the body portion of the transistor can be increased by the resistor 325, reducing the amount of current that will pass through the drain and damage the gate oxide 319. That is, without the deep N-well 304 and the P-well 308, positive charge from the substrate will pass through the drain 310 to a p-type substrate. However, by isolating the drain 310 with the deep N-well 304 and the P-well 308 and by providing a high resistance path between the P-type substrate and the P-well 308, excess charge will be discharged by way of the HBM diode at the N-type diffusion region 330 coupled to the I/O pad 334 without damage to the transistor 306.

Figure 4:
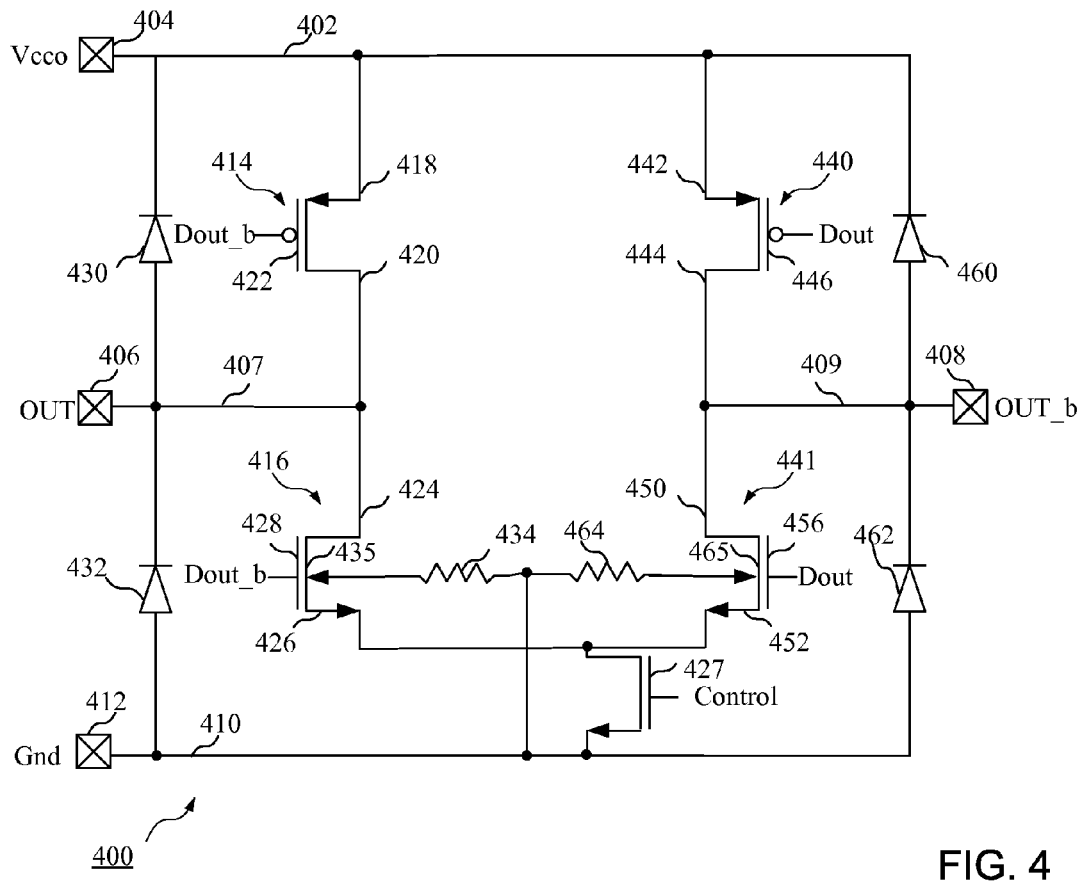
FIG. 4 is a block diagram of another circuit for enabling the discharge of electric charge in an integrated circuit.

Turning now to FIG. 4, a block diagram of another circuit for enabling the discharge of electric charge in an integrated circuit is shown. In particular, a reference node 402 is coupled to a reference voltage pin 404, designated here as Vcco. Differential outputs comprising a first output 406 at a node 407 and a second output 408 at a node 409 are provided. The circuit of FIG. 4 further comprises a CMOS transistor pair including transistors 414 and 416 which are coupled between the reference node 402 and the ground node 410. In particular, a source 418 of transistor 414 is coupled to the reference node 402, while a drain node 420 is coupled to the node 407. A gate 422 is coupled to receive an inverted output signal (Dout_b). A drain 424 of the N-channel transistor 416 is coupled to the node 407, while the source 426 is coupled to the node 410 by way of transistor 427. The inverted output signal is coupled to a gate 428 of the transistor 416.

A resistor 434 is coupled between a body portion 435 and the node 410. The resistor 434 effectively re-directs substrate discharge toward the intended low discharge path provided by low resistance HBM diode 432, as described above in reference to FIG. 2.

The circuit of FIG. 4 further comprises a CMOS transistor pair including transistors 440 and 441 coupled between the reference node 402 and the ground node 410 to generate the inverted output signal (OUT_b) at the output pad 408. In particular, a transistor 440 comprises a source 442 coupled to the reference node 402, while a drain 444 is coupled to the node 409. A gate 446 is coupled to receive the output signal (Dout). A drain 450 of the N-channel transistor 441 is coupled to the node 409, while the source 452 is coupled to the node 410 by way of the transistor 427. The output signal is coupled to a gate 456 of the transistor 441. An HBM diode 460 is coupled between the node 409 and the node 402, while an HBM diode 462 is coupled between the node 409 and the node 410. A resistor 464 is coupled between a body portion 465 of the transistor 441 and the node 410. The resistor 464 also effectively re-directs substrate discharge toward the intended low discharge path provided by low resistance HBM diode 462, as described above in reference to FIG. 2. The circuit of FIG. 4 could be a low voltage differential signaling (LVDS) circuit, for example.

Figures 1, 5:
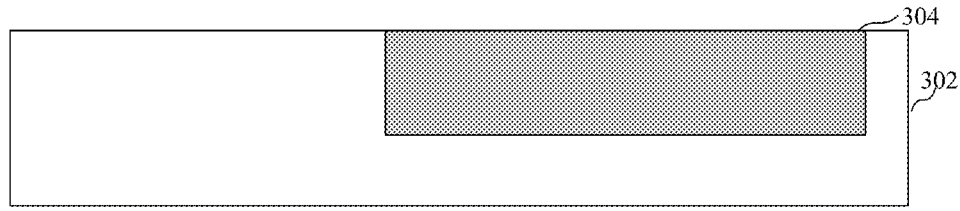
Figures 2, 5:
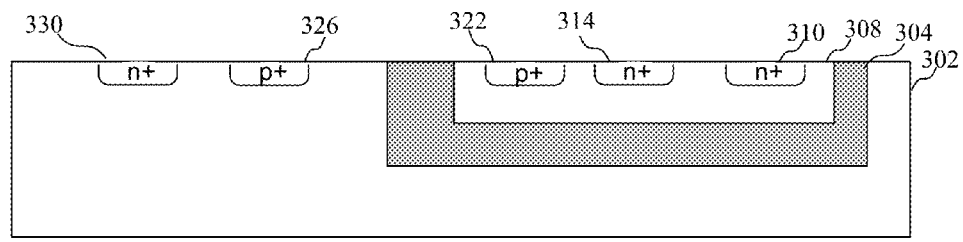
Figures 3, 5:
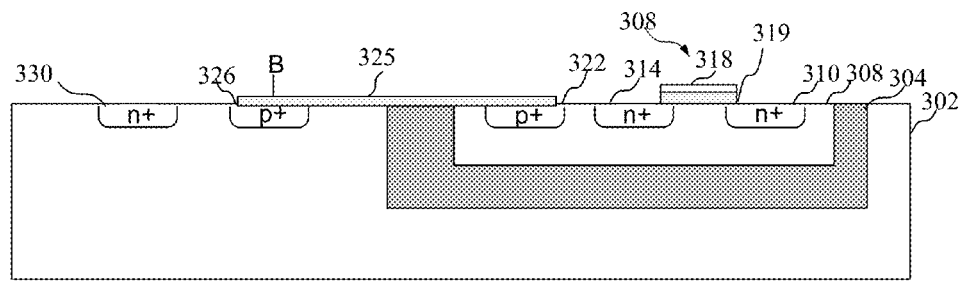
Figures 4, 5:
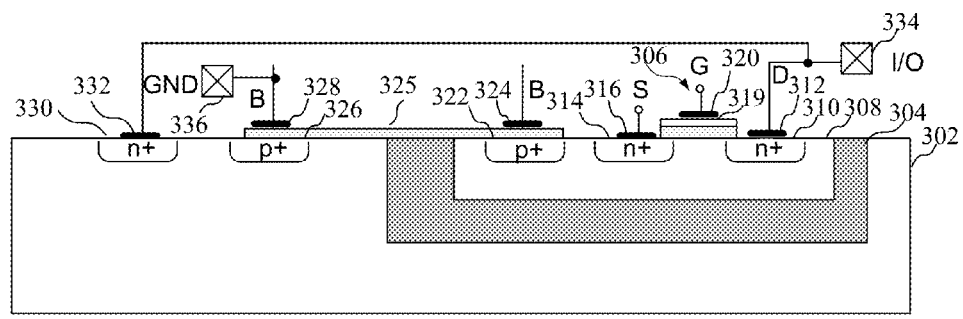

While specific examples of circuits are provided in FIGS. 2, 4, and 5, a resistor coupled between the body portion of an N-channel transistor and ground can be implemented in any other circuit which is coupled in series with a discharge path to increase the resistance between the body of a transistor and ground, and drive the charge toward an intended discharge path.

Turning now to FIGS. 5-1 through 5-4, a series of cross-sectional views shows the formation of the circuit according to FIG. 3. The deep N-well 304 is formed on the p-type wafer 302, as shown in FIG. 5-1. The n-type regions 310, 314 and 330 and the p-type regions 322 and 326 are then formed as shown in FIG. 5-2, where the N-type regions 310 and 314 and the P-type regions 322 are formed in the P-well 306. By providing the P-well 306 separate from the P-type wafer (where isolation is provided by the deep N-well 304), a separate discharge path for charge is provided at the drain region 310 to ground. That is, a resistor can be used to increase the resistance between the body of a transistor and ground, and force the excess charge at the drain to ground through an intended path provided by an HBM diode. Without isolating the diffusion region 310 and the drain, excess charge at the P-N junction of the diffusion region 310 could escape at the gate oxide 319, causing damage to the transistor 308. The various metal and oxide layers are then formed on the top surface of substrate. For example, a gate oxide 319 is formed, and the resistive material of resistor 325 and gate 318 may then be formed (if the resistor is formed using a material on the substrate). For example, the resistor 325 may be a polysilicon resistor formed on the surface of the substrate as shown in FIG. 5-3. The contact elements for the I/O pad and the GND pad (and any necessary contacts for the resistor 325 if the resistor is separate from the die) are then formed, as shown in FIG. 5-4.

Figure 6:
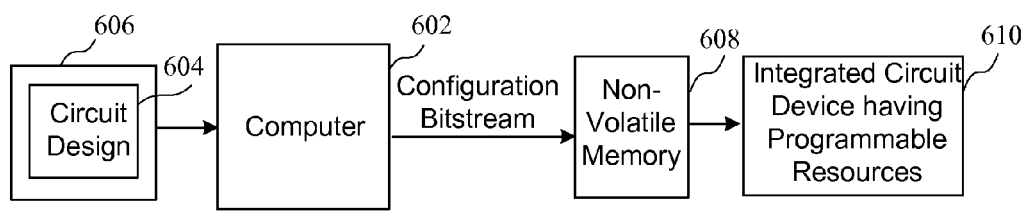
FIG. 6 is a block diagram of a system for programming a device having programmable resources.

Turning now to FIG. 6, a block diagram of a system for programming a device having programmable resources is shown. In particular, a computer 602 is coupled to receive a circuit design 604 from a memory 606, and generate a configuration bitstream which is stored in the non-volatile memory 606. As will be described in more detail below, the circuit design may be a high level design, such as a circuit design defined in a hardware description language (HDL). Also, the computer may be configured to run software that generates a configuration bitstream which is stored in the non-volatile memory 606.

The software flow for a circuit design to be implemented in a programmable integrated circuit comprises synthesis, packing, placement and routing, as is well known in the art. Synthesis comprises the step of converting a circuit design in a high level design to a configuration of elements found in the programmable integrated circuit. For example, a synthesis tool operated by the computer 602 may implement the portions of a circuit design implementing certain functions in configurable logic blocks (CLBs) or digital signal processing (DSP) blocks, for example. An example of a synthesis tool is the ISE tool available from Xilinx, Inc. of San Jose Calif. Packing comprises the step of grouping portions of the circuit design into defined blocks of the device, such as CLBs. Placing comprises the step of determining the location of the blocks of the device defined during the packing step. Finally, routing comprises selecting paths of interconnect elements, such as programmable interconnects, in a programmable integrated circuit. At the end of place and route, all functions, positions and connections are known, and a configuration bitstream is then created. The bitstream may be created by a software module called BitGen, available from Xilinx, Inc. of San Jose, Calif. The bitstream is either downloaded by way of a cable or programmed into an EPROM for delivery to the programmable integrated circuit.

Figure 7:
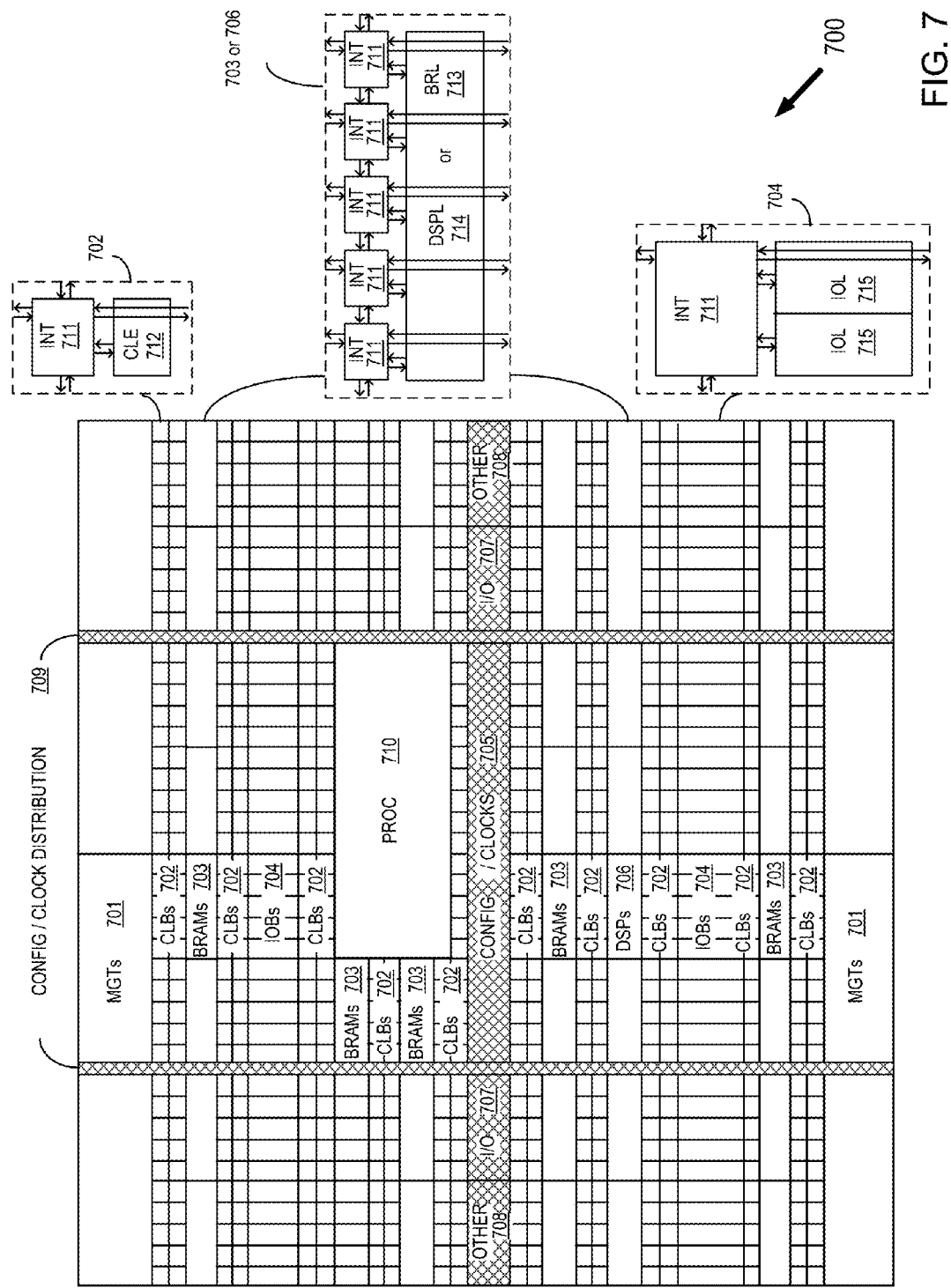
FIG. 7 is a block diagram of a device having programmable resources.

Turning now to FIG. 7, a block diagram of a programmable integrated circuit device having programmable resources according to an embodiment is shown. While devices having programmable resources may be implemented in any type of integrated circuit device, such as an application specific integrated circuit (ASIC) having programmable resources, other devices comprise dedicated programmable logic devices (PLDs). One type of PLD is the Complex Programmable Logic Device (CPLD). A CPLD includes two or more "function blocks" connected together and to input/output (I/O) resources by an interconnect switch matrix. Each function block of the CPLD includes a two-level AND/OR structure similar to that used in a Programmable Logic Array (PLA) or a Programmable Array Logic (PAL) device. Another type of PLD is a field programmable gate array (FPGA). In a typical FPGA, an array of configurable logic blocks (CLBs) is coupled to programmable input/output blocks (IOBs). The CLBs and IOBs are interconnected by a hierarchy of programmable routing resources. These CLBs, IOBs, and programmable routing resources are customized by loading a configuration bitstream, typically from off-chip memory, into configuration memory cells of the FPGA. For both of these types of programmable logic devices, the functionality of the device is controlled by configuration data bits of a configuration bitstream provided to the device for that purpose. The configuration data bits may be stored in volatile memory (e.g., static memory cells, as in FPGAs and some CPLDs), in non-volatile memory (e.g., Flash memory, as in some CPLDs), or in any other type of memory cell.

The device of FIG. 7 comprises an FPGA architecture 700 having a large number of different programmable tiles including multi-gigabit transceivers (MGTs) 701, CLBs 702, random access memory blocks (BRAMs) 703, input/output blocks (IOBs) 704, configuration and clocking logic (CONFIG/CLOCKS) 705, digital signal processing blocks (DSPs) 706, specialized input/output blocks (I/O) 707 (e.g., configuration ports and clock ports), and other programmable logic 708 such as digital clock managers, analog-to-digital converters, system monitoring logic, and so forth. Some FPGAs also include dedicated processor blocks (PROC) 710, which may be used to implement a software application, for example.

In some FPGAs, each programmable tile includes a programmable interconnect element (INT) 711 having standardized connections to and from a corresponding interconnect element in each adjacent tile. Therefore, the programmable interconnect elements taken together implement the programmable interconnect structure for the illustrated FPGA. The programmable interconnect element 711 also includes the connections to and from the programmable logic element within the same tile, as shown by the examples included at the top of FIG. 7.

For example, a CLB 702 may include a configurable logic element (CLE) 712 that may be programmed to implement user logic plus a single programmable interconnect element 711. A BRAM 703 may include a BRAM logic element (BRL) 713 in addition to one or more programmable interconnect elements. The BRAM includes dedicated memory separate from the distributed RAM of a configuration logic block. Typically, the number of interconnect elements included in a tile depends on the height of the tile. In the pictured embodiment, a BRAM tile has the same height as five CLBs, but other numbers may also be used. A DSP tile 706 may include a DSP logic element (DSPL) 714 in addition to an appropriate number of programmable interconnect elements. An IOB 704 may include, for example, two instances of an input/output logic element (IOL) 715 in addition to one instance of the programmable interconnect element 711. The location of connections of the device is controlled by configuration data bits of a configuration bitstream provided to the device for that purpose. The programmable interconnects, in response to bits of a configuration bitstream, enable connections comprising interconnect lines to be used to couple the various signals to the circuits implemented in programmable logic, or other circuits such as BRAMs or the processor.

In the pictured embodiment, a columnar area near the center of the die is used for configuration, clock, and other control logic. Horizontal areas 609 extending from this column are used to distribute the clocks and configuration signals across the breadth of the FPGA. Some FPGAs utilizing the architecture illustrated in FIG. 7 include additional logic blocks that disrupt the regular columnar structure making up a large part of the FPGA. The additional logic blocks may be programmable blocks and/or dedicated logic. For example, the processor block PROC 710 shown in FIG. 7 spans several columns of CLBs and BRAMs.

Note that FIG. 7 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 7 are purely exemplary. For example, in an actual FPGA more than one adjacent column of CLBs is typically included wherever the CLBs appear in order to facilitate the efficient implementation of user logic. While the embodiment of FIG. 7 relates to an integrated circuit having programmable resources, it should be understood that the circuits and methods set forth in more detail below could be implemented in any type of ASIC.

Figure 8:
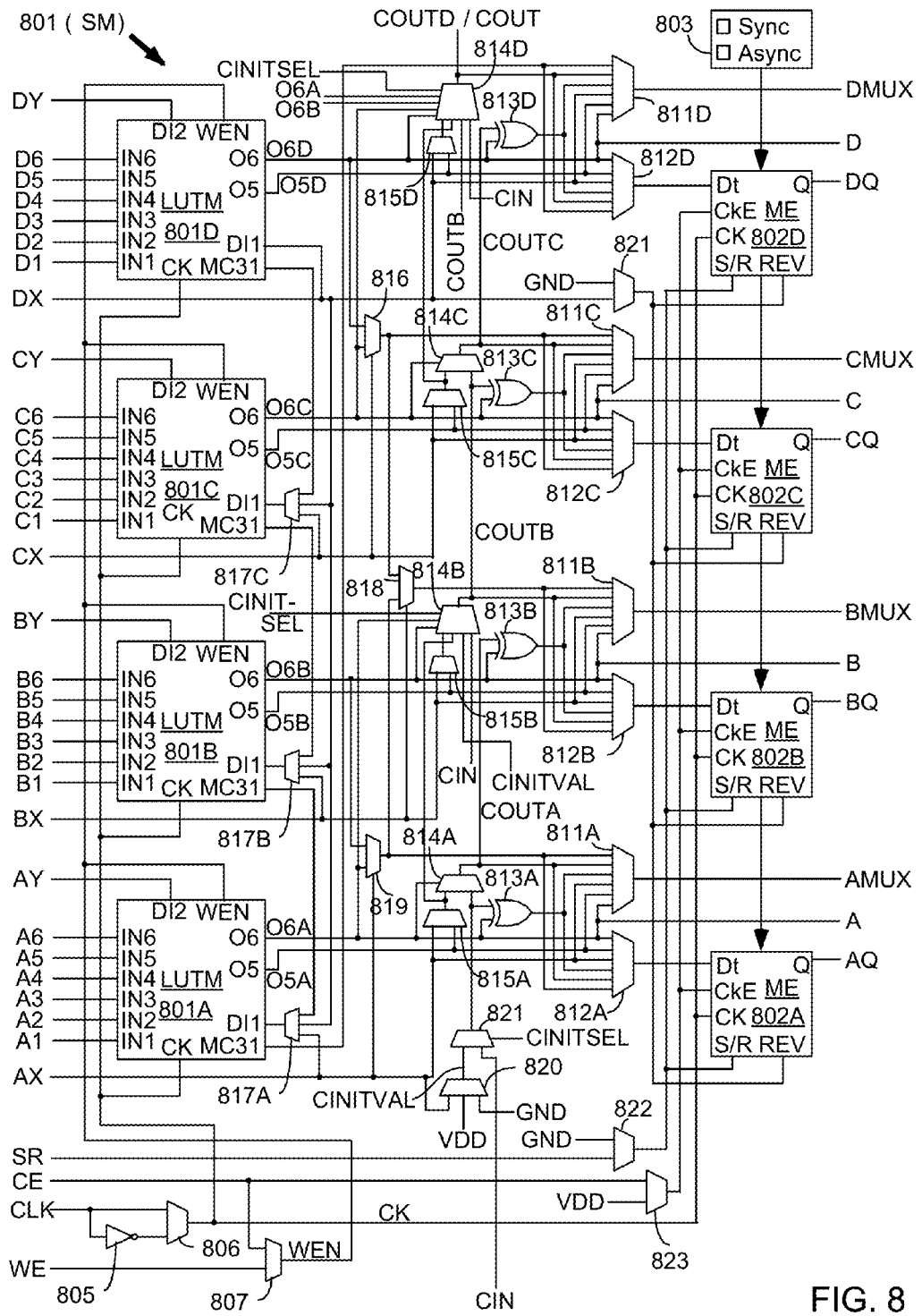
FIG. 8 is block diagram of a configurable logic element of the device of FIG. 7.

Turning now to FIG. 8, a block diagram of a configurable logic element according to an embodiment is shown. In particular, FIG. 8 illustrates in simplified form a configurable logic element of a configuration logic block 702 of FIG. 7. In the embodiment of FIG. 8, slice M 801 includes four lookup tables (LUTMs) 801A-801D, each driven by six LUT data input terminals A1-A6, B1-B6, C1-C6, and D1-D6 and each providing two LUT output signals O5 and O6. The O6 output terminals from LUTs 801A-801D drive slice output terminals A-D, respectively. The LUT data input signals are supplied by the FPGA interconnect structure via input multiplexers, which may be implemented by programmable interconnect element 811, and the LUT output signals are also supplied to the interconnect structure. Slice M also includes: output select multiplexers 811A-811D driving output terminals AMUX-DMUX; multiplexers 812A-812D driving the data input terminals of memory elements 802A-802D; combinational multiplexers 816, 818, and 819; bounce multiplexer circuits 822-823; a circuit represented by inverter 805 and multiplexer 806 (which together provide an optional inversion on the input clock path); and carry logic having multiplexers 814A-814D, 815A-815D, 820-821 and exclusive OR gates 813A-813D. All of these elements are coupled together as shown in FIG. 8. Where select inputs are not shown for the multiplexers illustrated in FIG. 8, the select inputs are controlled by configuration memory cells. That is, configuration bits of the configuration bitstream stored in configuration memory cells are coupled to the select inputs of the multiplexers to select the correct inputs to the multiplexers. These configuration memory cells, which are well known, are omitted from FIG. 8 for clarity, as well as from other selected figures herein.

In the pictured embodiment, each memory element 802A-802D may be programmed to function as a synchronous or asynchronous flip-flop or latch. The selection between synchronous and asynchronous functionality is made for all four memory elements in a slice by programming Sync/Asynch selection circuit 803. When a memory element is programmed so that the S/R (set/reset) input signal provides a set function, the REV input terminal provides the reset function. When the memory element is programmed so that the S/R input signal provides a reset function, the REV input terminal provides the set function. Memory elements 802A-802D are clocked by a clock signal CK, which may be provided by a global clock network or by the interconnect structure, for example. Such programmable memory elements are well known in the art of FPGA design. Each memory element 802A-802D provides a registered output signal AQ-DQ to the interconnect structure. Because each LUT 801A-801D provides two output signals, O5 and O6, the LUT may be configured to function as two 5-input LUTs with five shared input signals (IN1-IN5), or as one 6-input LUT having input signals IN1-IN6.

In the embodiment of FIG. 8, each LUTM 801A-801D may function in any of several modes. When in lookup table mode, each LUT has six data input signals IN1-IN6 that are supplied by the FPGA interconnect structure via input multiplexers. One of 64 data values is programmably selected from configuration memory cells based on the values of signals IN1-IN6. When in RAM mode, each LUT functions as a single 64-bit RAM or two 32-bit RAMs with shared addressing. The RAM write data is supplied to the 64-bit RAM via input terminal DI1 (via multiplexers 817A-817C for LUTs 801A-801C), or to the two 32-bit RAMs via input terminals DI1 and DI2. RAM write operations in the LUT RAMs are controlled by clock signal CK from multiplexer 806 and by write enable signal WEN from multiplexer 807, which may selectively pass either the clock enable signal CE or the write enable signal WE. In shift register mode, each LUT functions as two 16-bit shift registers, or with the two 16-bit shift registers coupled in series to create a single 32-bit shift register. The shift-in signals are provided via one or both of input terminals DI1 and DI2. The 16-bit and 32-bit shift out signals may be provided through the LUT output terminals, and the 32-bit shift out signal may also be provided more directly via LUT output terminal MC31. The 32-bit shift out signal MC31 of LUT 801A may also be provided to the general interconnect structure for shift register chaining, via output select multiplexer 811D and CLE output terminal DMUX. Accordingly, the circuits and methods set forth above may be implemented in a device such as the devices of FIGS. 7 and 8, or any other suitable device.

Figure 9:
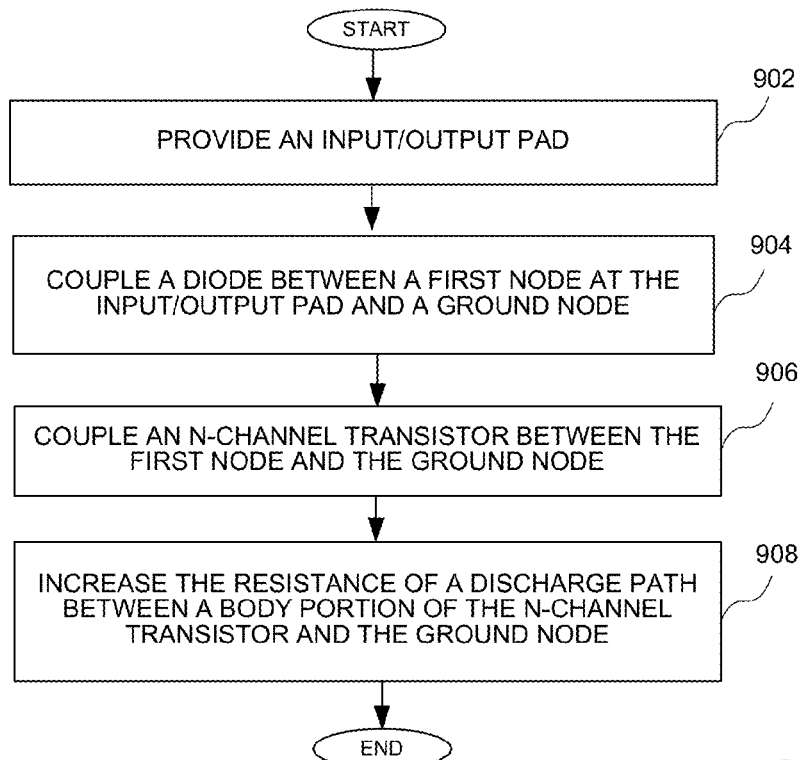
FIG. 9 is a flow chart showing a method of enabling the discharge of electric charge in an integrated circuit.

FIG. 9 shows a method of enabling the discharged of electric charge in an integrated circuit. In particular, an input/output pad is provided at a step 902, and a diode is coupled between a first node at the input/output pad and a ground node at a step 904. An N-channel transistor is then coupled between the first node and the ground node at a step 906. The resistance of a discharge path between a body portion of the N-channel transistor and the ground node is increased at a step 908.

Figure 10:
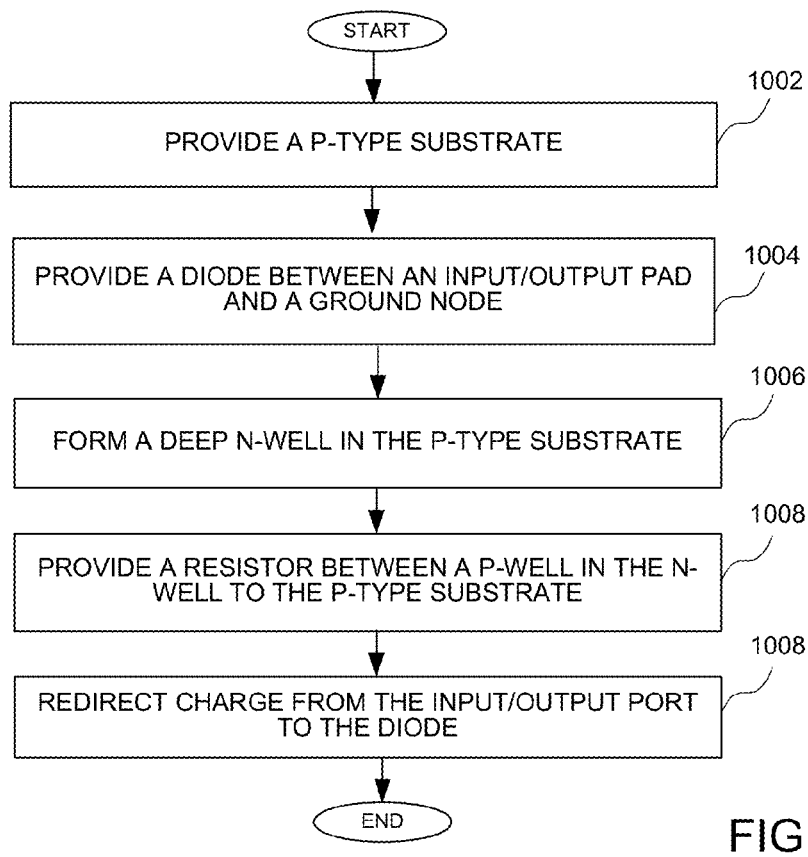
FIG. 10 is a flow chart showing a method of forming an integrated circuit having a circuit which enables the discharge of electric charge.

FIG. 10 shows a method of forming an integrated circuit having a circuit which enables the discharge of electric charge. A P-type substrate is provided at a step 1002. A diode is provided between an input/output pad and a ground node at a step 1004. A deep N-well is formed in the P-type substrate at a step 1006, and a resistor is provided between a P-well in the N-well to the P-type substrate at a step 1008. Charge is then redirected from the input/output port to the diode at a step 1010. The methods of FIGS. 9 and 10 may be implemented using the various circuits and integrated circuit packages as shown in FIGS. 1-8, or other suitable circuits and devices.

It can therefore be appreciated that new circuits for and methods of discharging electric charge in an integrated circuit have been described. It will be appreciated by those skilled in the art that numerous alternatives and equivalents will be seen to exist that incorporate the disclosed invention. As a result, the invention is not to be limited by the foregoing embodiments, but only by the following claims.

What is claimed is:

1. A circuit for enabling the discharge of electric charge in an integrated circuit, the circuit comprising:
   a P-type substrate;
   an N-well formed in the P-type substrate;
   an input/output pad coupled to a first node;
   a first diode coupled between the first node and a ground node;
   a transistor coupled in parallel with the first diode between the first node and the ground node, wherein a drain of the transistor is coupled to the input/output pad and a gate of the transistor receives output data to be generated at the input/output pad;
   a resistor coupled between a body portion of the transistor and the ground node; and
   an N-type region formed in the P-type substrate and enabling charge to be coupled from the first node to the P-type substrate.

2. The circuit of claim 1, further comprising a second diode and a P-channel transistor coupled in parallel between the first node and a power node.

3. The circuit of claim 2, further comprising a driver having a pair of P-channel transistors coupled in series between the first node and the power node and a pair of N-channel transistors coupled in series between the first node and the ground node.

4. The circuit of claim 3, further comprising a resistor coupled between a body portion of a first transistor of the pair of N-channel transistors and the ground node.

5. The circuit of claim 1, wherein:
   the transistor comprises an N-channel transistor;
   the N-well comprises a deep N-well formed in the P-type substrate; and
   source and drain regions of the N-channel transistor are formed in a P-well of the deep N-well.

6. The circuit of claim 5, wherein the resistor is formed between the p-well and the P-type substrate.

7. The circuit of claim 6, wherein the resistor comprises a polysilicon resistor formed on the P-type substrate.

8. A circuit for enabling the discharge of electric charge in an integrated circuit, the circuit comprising:
   a p-type substrate;
   an N-well formed in the P-type substrate;
   a first input/output pad coupled to a first node;
   a first diode coupled between the first node and a ground node;
   a first transistor coupled in parallel with the first diode between the first node and the ground node, wherein a drain of the first transistor is coupled to the first input/output pad and a gate of the first transistor receives first output data to be generated at the first input/output pad;
   a first resistor coupled between a body portion of the first transistor and the ground node;
   a first N-type region formed in the P-type substrate and enabling charge to be coupled from the first node to the P-type substrate;
   a second input/output pad coupled to a second node;
   a second diode coupled between the second node and the ground node;
   a second transistor coupled in parallel with the second diode between the second node and the ground node, wherein a drain of the second transistor is coupled to the second input/output pad and a gate of the second transistor receives second output data to be generated at the second input/output pad;
   a second resistor coupled between a body portion of the second transistor and the ground node; and
   a second N-type region formed in the P-type substrate and enabling charge to be coupled from the second node to the P-type substrate.

9. The circuit of claim 8, further comprising a third diode and a third transistor coupled in parallel between the first node and a power node.

10. The circuit of claim 9, further comprising a fourth diode and a fourth transistor coupled in parallel between the second node and the power node.

11. The circuit of claim 8, further comprising a third transistor coupled between each of the first and second transistors and the ground node.

12. The circuit of claim 8, wherein:
   source and drain regions of the first transistor are formed in a first P-well of the deep N-well; and
   the first resistor is formed between the first P-well and the P-type substrate.

13. The circuit of claim 12, wherein:
   source and drain regions of the second transistor are formed in a second P-well; and
   the second resistor is formed between the second P-well and the P-type substrate.

14. The circuit of claim 13, wherein the first and second resistors comprise polysilicon resistors formed on the P-type substrate.

15. A method of enabling the discharge of electric charge in an integrated circuit, the method comprising:
providing a P-type substrate;
providing a N-well formed in the P-type substrate;
providing an input/output pad;
coupling a diode between a first node at the input/output pad and a ground node;
coupling a transistor between the first node and the ground node, wherein a drain of the transistor is coupled to the input/output pad and a gate of the transistor receives output data to be generated at the input/output pad;
increasing the resistance of a discharge path between a body portion of the transistor and the ground node; and
enabling charge to be coupled from the first node to the P-type substrate by way of the diode.

16. The method of claim 15, wherein:
the transistor comprises an N-channel transistor:
providing an N-well in the P-type substrate comprises providing a deep N-well in the P-type substrate; and
coupling an N-channel transistor between a first node and the ground node comprises forming source and drain regions of the N-channel transistor in a P-well of the deep N-well.

17. The method of claim 15, wherein coupling a diode between a first node at the input/output pad and a ground node comprises forming an N-type region in the P-type substrate.

18. The method of claim 15, wherein increasing the resistance of a discharge path between a body portion of the transistor and the ground node comprises providing a resistor between the body portion of the transistor and the ground node.

19. The method of claim 18, wherein providing a resistor between the body portion of the transistor and the ground node comprises forming a polysilicon resistor on the substrate.

20. The method of claim 15, further comprising redirecting charge from the input/output pad to the diode.

* * * * *